United States Patent [19]

Rode et al.

[11] Patent Number: 4,467,340
[45] Date of Patent: Aug. 21, 1984

[54] PRE-MULTIPLEXED SCHOTTKY BARRIER FOCAL PLANE

[75] Inventors: Jonathan P. Rode; Kuen Chow, both of Thousand Oaks, Calif.

[73] Assignee: Rockwell International Corporation, El Segundo, Calif.

[21] Appl. No.: 321,360

[22] Filed: Nov. 16, 1981

[51] Int. Cl.³ .................... H01L 29/78; H01L 27/14; H01L 31/00; H01L 29/56
[52] U.S. Cl. ........................................ 357/24; 357/15; 357/30; 250/338
[58] Field of Search ............... 357/15, 24 LR, 30; 250/338, 370

[56] References Cited

U.S. PATENT DOCUMENTS

| | | | |
|---|---|---|---|
| 3,808,435 | 4/1974 | Bate et al. | 357/24 LR |
| 3,902,066 | 8/1975 | Roosild et al. | 357/24 LR |
| 4,040,076 | 8/1977 | Kosonocky et al. | 357/30 |
| 4,197,469 | 4/1980 | Cheung | 357/30 |

OTHER PUBLICATIONS

Kohn, A Charge-Coupled Infrared Imaging Array with Schottky-Barrier Detectors, IEEE Trans. Elec. Dev., vol. ED-23, p. 207, (1976).
Longo et al., Infrared Focal Planes in Intrinsic Semiconductors, IEEE Trans. Elec. Dev., vol. ED-25, p. 213, (1978).

Primary Examiner—Gene M. Munson
Attorney, Agent, or Firm—H. Fredrick Hamann; Craig O. Malin; John J. Deinken

[57] ABSTRACT

Disclosed is a hybrid Schottky barrier focal plane, which includes a transparent semiconducting detector substrate of a first conductivity, with an array of detector groups disposed on the detector substrate, each group including a plurality of Schottky barrier detectors. An output contact is provided on the detector substrate for each of the detector groups. A field effect transistor for each detector includes a source region of a second conductivity type in the detector substrate and connected to the detector, a drain region of the second conductivity type in the detector substrate over the source and drain regions for controlling the connection between the source region and the drain region. An array of output contacts are disposed on a semiconducting multiplexer substrate, which also includes a charge coupled circuit for converting parallel signals from the input contacts to a serial output signal. An array of coupling elements is provided to connect each of the output contacts on the detector substrate to one of the input contacts on the multiplexer substrate.

13 Claims, 8 Drawing Figures

PRE-MULTIPLEXED SCHOTTKY BARRIER FOCAL PLANE

BACKGROUND OF THE INVENTION

This invention relates to solid state focal planes for providing imaging by detecting the light emanating from an imaged scene.

The advanced imaging systems which have been developed in the infrared detection art incorporates a focal plane which is an integration of a large array of detectors with appropriate signal processing electronics. In some tactical and strategic target acquisition or surveillance applications, these arrays must be provided in a high density format, with two basic types of such infrared focal planes, monolithic and hybrid, available in designing an imaging system. A monolithic focal plane is fabricated with the multiplexer as an integral part of the detector structure, while the photodetector array and the signal multiplexer of a hybrid focal plane are produced separately, then joined together using an advanced interconnection technology.

Whether the monolithic or hybrid configuration is chosen, the focal plane must accomplish the complementary functions of photon detection including prefiltering of the optical signal, and signal multiplexing. In operation, the focal plane is irradiated with infrared background and signal energy. This optical signal is filtered and collected by the detectors, with the resulting electrical signal produced by the detectors then being coupled to the multiplexer through interfacing electronics. In this procedure, some signal processing, such as background suppression, is sometimes required for conditioning the incoming signal so that the multiplexer can be operated effectively. The output of the multiplexer will then provide a video signal which contains all the scene information within the field of view of the focal plane.

Although a number of approaches are available, the charge coupled device (CCD) has emerged as the preferred multiplexer for such focal planes due to the low noise characteristics of this device. The CCD approach to infrared focal plane multiplexing is based on the charge coupling concept, namely, the collective transfer of all the mobile charge contained within a semiconductor storage element to a similar, adjacent storage element by the external manipulation of voltages. A typical n-channel CCD consists of a p-type silicon substrate with a silicon dioxide insulating layer on its surface and an array of conducting electrodes deposited on the surface of the insulator. When a periodic waveform, known as the clock voltage, is applied to the electrode, some of the electrons in the vicinity of each electrode will form a discrete packet of charge and move a distance of one charge coupled element, or unit cell, for each full clock cycle. The packets of electron charge are thus transferred as a result of the continuous lateral displacement of the local potential wells created by the clock voltage.

In addition to its utility as a multiplexing device, the charge coupled concept may also be employed to achieve image sensing directly. Imaging with charge coupled devices has been an area of intense activity since the charge coupling technique was first developed, and imagers operating in the visible spectrum with full television resolution have been demonstrated. If an array of potential wells, such as those formed by a CCD is provided, photoemitted electrons will fill the wells to a level corresponding to the amount of light in their vicinity. These packets of electrons which are generated by the light can be transferred to a point of detection and converted to an electrical signal representing the optical image which is incident on the device.

Although such imaging devices have been investigated with a variety of gate structures, channel types, and chip layouts, most of these imagers use silicon as the photon absorbing material, thereby limiting their usefulness as infrared imagers to wavelengths less than approximately 1.1 $\mu$m. Considerably interest exists, however, in imagers sensitive to longer wavelength infrared radiation. Imagers responsive in the 2-3 $\mu$m range, for example, are useful in military applications for viewing high contrast scenes, such as jet and rocket plumes. Furthermore, devices responsive to higher wavelength radiation can image 300° K. scenes using emitted thermal radiation, and are of interest for industrial and medical uses as well as in military applications.

One way in which silicon-based devices may be employed for imaging tasks in the medium and long wavelength infrared range is through the use of the Schottky barrier concept. A simple Schottky barrier device consists of a metal layer which has been evaporated onto a semiconductor wafer through an opening in an overlying insulator layer. This device exhibits electrical characteristics which are similar to the p-n junction, its properties depending upon the barrier height at the metal-semiconductor interface in much the same way that the characteristics of the p-n junction depend upon the bandgap. The barrier height is a function of the metal which is selected and the choice and polarity of the semiconductor, but is nearly independent of the doping applied to the semiconductor. A reverse-biased Schottky barrier diode will generate a dark current resulting from the collection by the metal of minority carriers thermally generated in the semiconductor and from the thermal excitation of majority carriers in the metal over the barrier into the semiconductor. Since the barrier height for the infrared spectral range of interest is less than half the bandgap of silicon, the latter process will dominate.

The Schottky barrier device operates as a photoconductor by absorbing light in the metal. The Schottky electrodes may be either metals or metal silicides, the latter being formed by a solid state reaction. A potential barrier will exist between the metal or silicide and the silicon substrate, so that infrared photons may pass through the silicon and be absorbed at the Schottky electrode, resulting in the excitation of carriers which are then internally emitted over the Schottky barrier into the silicon. The quantum of efficiency for this mechanism is relatively low, but the response extends to photon energies as low as the barrier height, a value which can be considerably lower than the bandgap. Since the spectral yield in such a device depends almost entirely on the absorption process in the metal and the emission of majority carriers over the barrier, its sensitivity is nearly independent of such parameters as semiconductor doping and minority carrier lifetime, thereby eliminating some of the major sources of nonuniformity in conventional semiconductors.

The use of silicon monolithic processing technology in the fabrication of Schottky retinas can lead to good photoresponse uniformities with significant reductions in the cost and complexity of a thermal energy system.

The Schottky barrier detector techniques which have been developed in the prior art, however, are not adaptable to some applications because of two constraints: the necessity for a large (typically 80×160 μm) cell size and the characteristically low "fill factor" (which may be defined as the percentage of light detecting area relative to the total focal plane area) of approximately 15-30%. The large cell size makes larger diameter optics necessary in order to collect enough signal, while the low fill factor impacts both the amount of signal collected and aliasing, i.e., the capability of the focal plane to resolve image details of a particular size. Consequently a focal plane architecture which could eliminate these limitations of the Schottky barrier detector would be welcome in the infrared imaging art and would broaden the potential applications for such detectors.

SUMMARY OF THE INVENTION

It is a general objective of this invention to provide a new and improved Schottky barrier focal plane.

A pre-multiplexed Schottky barrier detector array, according to this invention, includes a transparent semiconducting substrate, with an array of detector groups disposed on the substrate, each group including a plurality of Schottky barrier detectors. An output contact is provided on the substrate for each of the detector groups and a switching device associated with each detector is included for selectively connecting each detector to one of the output contacts.

In a more particular embodiment, the detector includes a transparent semiconducting substrate of a first conductivity type, with an array of detector groups disposed on the substrate, each group including a plurality of Schottky barrier detectors. An output contact is provided on the substrate for each of the detector groups. A field effect transistor for each detector is included, with a source region of a second conductivity type in the substrate and connected to the detector, a drain region of the second conductivity type in the substrate and connected to one of the output contacts, and a gate on the substrate over the source and drain regions for controlling the connection between the source region and the drain region.

A hybrid Schottky barrier focal plane constructed according to this invention includes a transparent semiconducting detector substrate with an array of detector groups disposed on the detector substrate, each group including a plurality of Schottky barrier detectors. An output contact is provided on the detector substrate for each of the detector groups, while a switching device associated with each detector on the detector substrate is arranged to selectively connect each detector to one of the output contacts. A semiconducting multiplexer substrate is provided with an array of input contacts disposed on the surface. A charge coupled circuit on the multiplexer substrate converts parallel signals from the input contact to a serial output signal, while an array of coupling elements provides a connection between each input contact and an output contact on the detector substrate.

A method of making a pre-multiplexed Schottky barrier detector according to the present invention begins with the step of providing a transparent semiconducting substrate of a first conductivity type. A field isolation pattern is deposited on the substrate to define an array of output areas and a preselected number of detector areas adjacent to each output area. A conducting line is deposited on the substrate between each output area and each associated detector area. Regions of a second conductivity type are then formed in the substrate between each detector area and the associated conducting line and between each output area and the associated conducting lines. Finally, a Schottky barrier metallization is applied to the substrate in the detector areas and a metallic contact layer is deposited over the output areas and over the detector areas.

In a more particular embodiment, the step of depositing a conducting line further involves depositing a polysilicon line on the substrate and the step of applying a Schottky barrier metallization involves applying a thin film of platinum and sintering to form a platinum silicide Schottky barrier diode.

These examples summarize some of the more important features of this invention. There are, of course, additional details involved in the invention, which are further described below and which are included within the subject matter of the appended claims.

BRIEF DESCRIPTION OF THE DRAWINGS

Additional objectives, features, and advantages of the present invention will be evident from the description below of the preferred embodiments and the accompanying drawings, wherein the same numerals are used to refer to like elements throughout all the figures. In the drawings:

FIG. 7 is a side view in cross section illustrating a hybrid Schottky barrier focal plane constructed according to the present invention.

DESCRIPTION OF THE PREFERRED EMBODIMENT

It is an outstanding feature of the present invention to provide an improved Schottky barrier focal plane which overcomes the problems of low fill factor and aliasing by incorporating pre-multiplexing on the detector substrate of a hybrid focal plane. With this technique, groups of two or more Schottky barrier detector diodes are switched to common output points on the detector. Interconnects are then made from the common outputs points to the multiplexer, using a mass interconnect method. With this architecture, a significant reduction in the unit cell size of the detectors can be made with a concomitant increase in the active area of the device. These advantages occur because the CCD multiplexer and the detector do not share a common plane (as is necessary in a monolithic device) and because the premultiplexing of m detectors allows the interconnect spacing and the multiplexer unit cell to occupy m times as much area as a unit detector cell. Moreover, because the Schottky barrier can store signal charge, this premultiplexing does not require any sacrifice in the duty cycle (the amount of frame time in which a detector can store charge).

FIGS. 1-6 are plan views illustrating the sequence of steps involved in manufacturing the detector focal plane of a hybrid Schottky barrier focal plane according to this invention. As will be appreciated by those skilled in the art, only a small portion of an actual detector focal plane is shown in the drawing and that portion is illustrated with greatly exaggerated dimensions in order to adequately depict the features of the design. Furthermore, although the particular embodiment discussed herein employs Pt-Si Schottky barriers on an Si substrate, those skilled in the art will appreciate that many other Schottky barrier metals may be used and that other semiconductor substrates, such as Ge or HgCdTe, might also be used.

Figure 1:
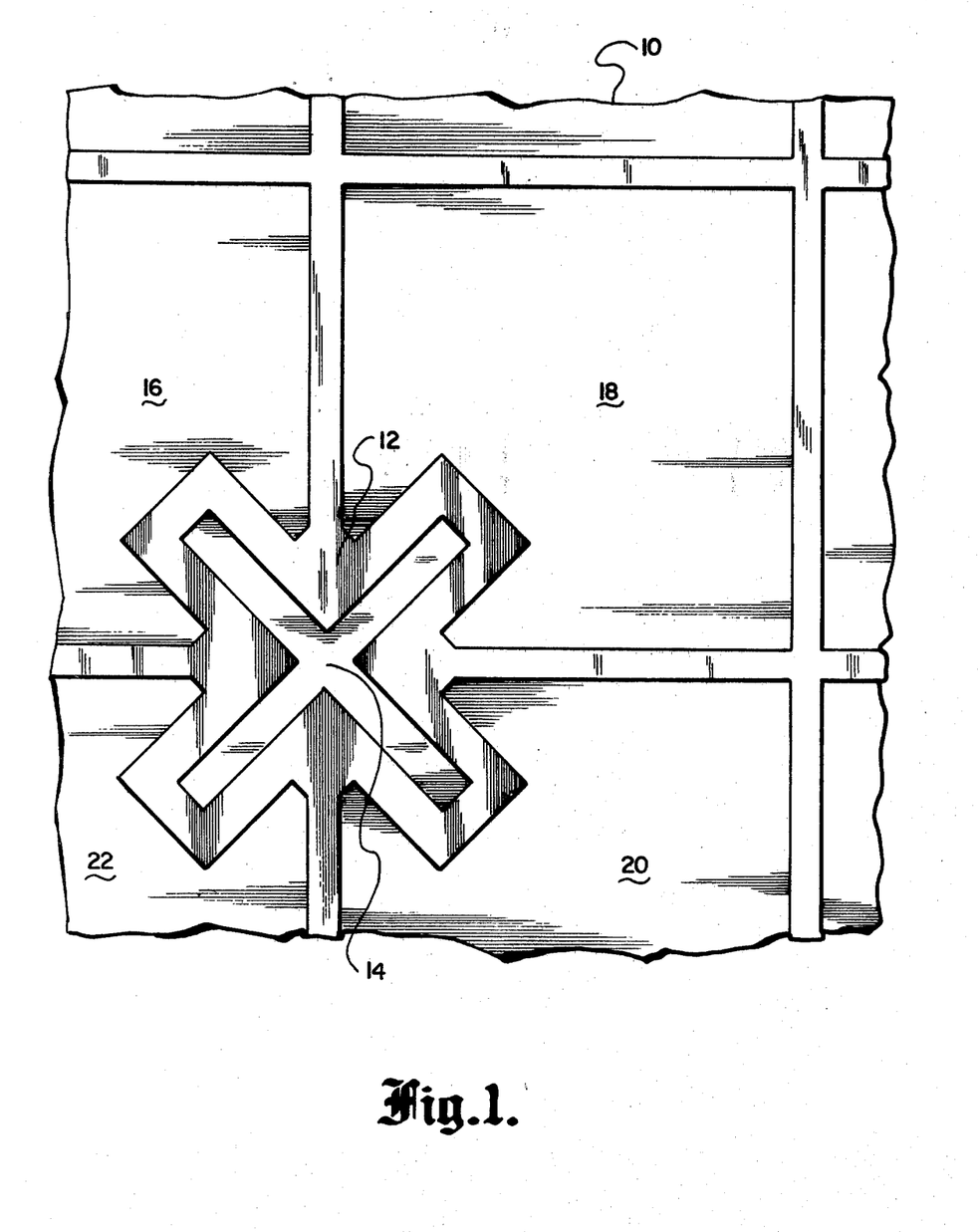
FIGS. 1-6 are plan views illustrating the sequence of steps involved in manufacturing a detector focal plane according to the present invention.

The manufacturing sequence begins, as shown in FIG. 1, with a 20–50Ω-cm double-side polished p-type (100) silicon detector substrate 10, on which is grown a silicon dioxide field isolation pattern 12. The field isolation pattern defines a number of output areas 14 and a preselected number (four in this embodiment) of detector areas, such as areas 16, 18, 20, and 22, which form a detector group adjacent to each output area. This pattern is regularly repeated over the surface of the detector substrate to form an array of output areas, each with an associated group of adjacent detectors. In the embodiment illustrated, four to one pre-multiplexing is provided since four detectors can be connected to each output area. As those skilled in the art will appreciate, however, the advantages of this invention may be achieved with other pre-multiplexing ratios, limited only by the number of detectors which it is practical to locate adjacent to each output point.

Figure 2:
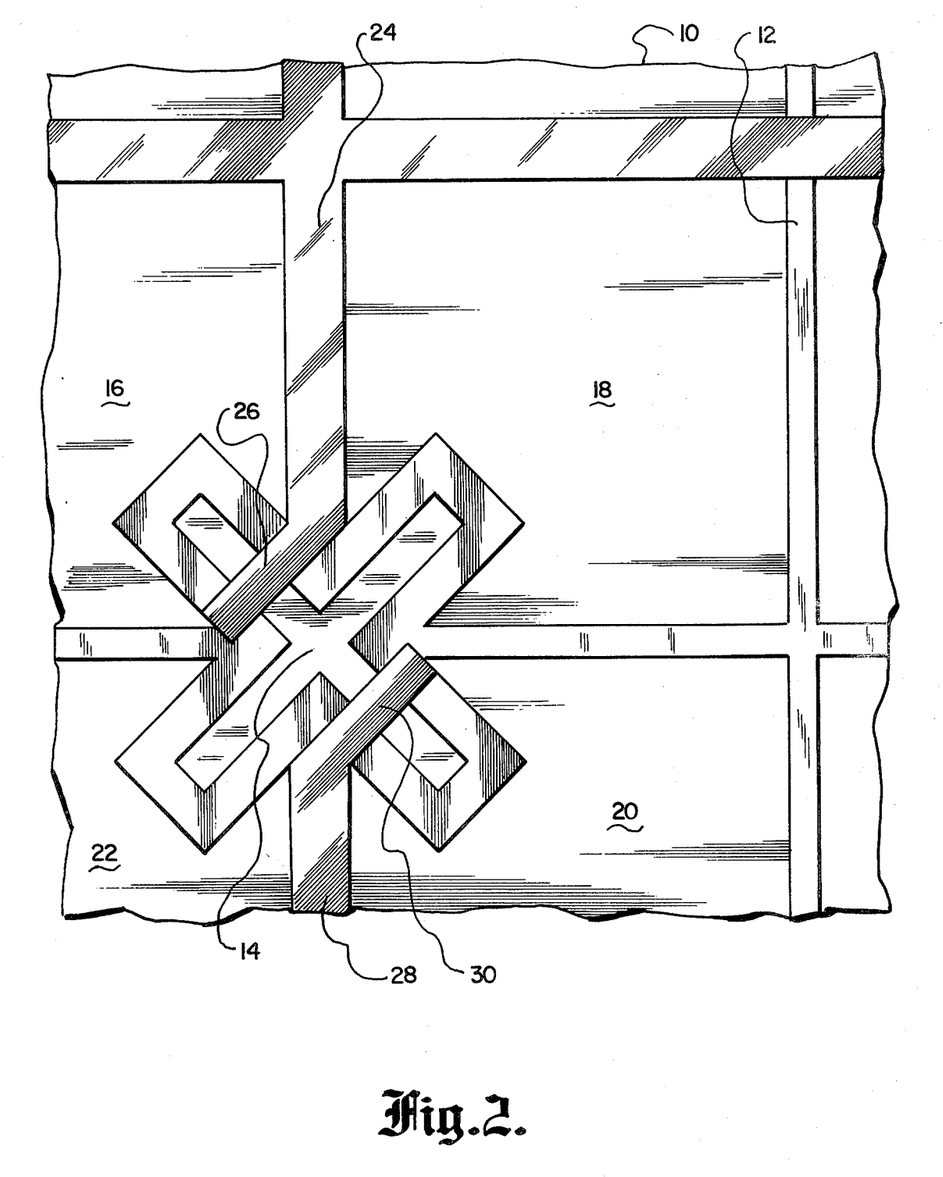
Figure 3:
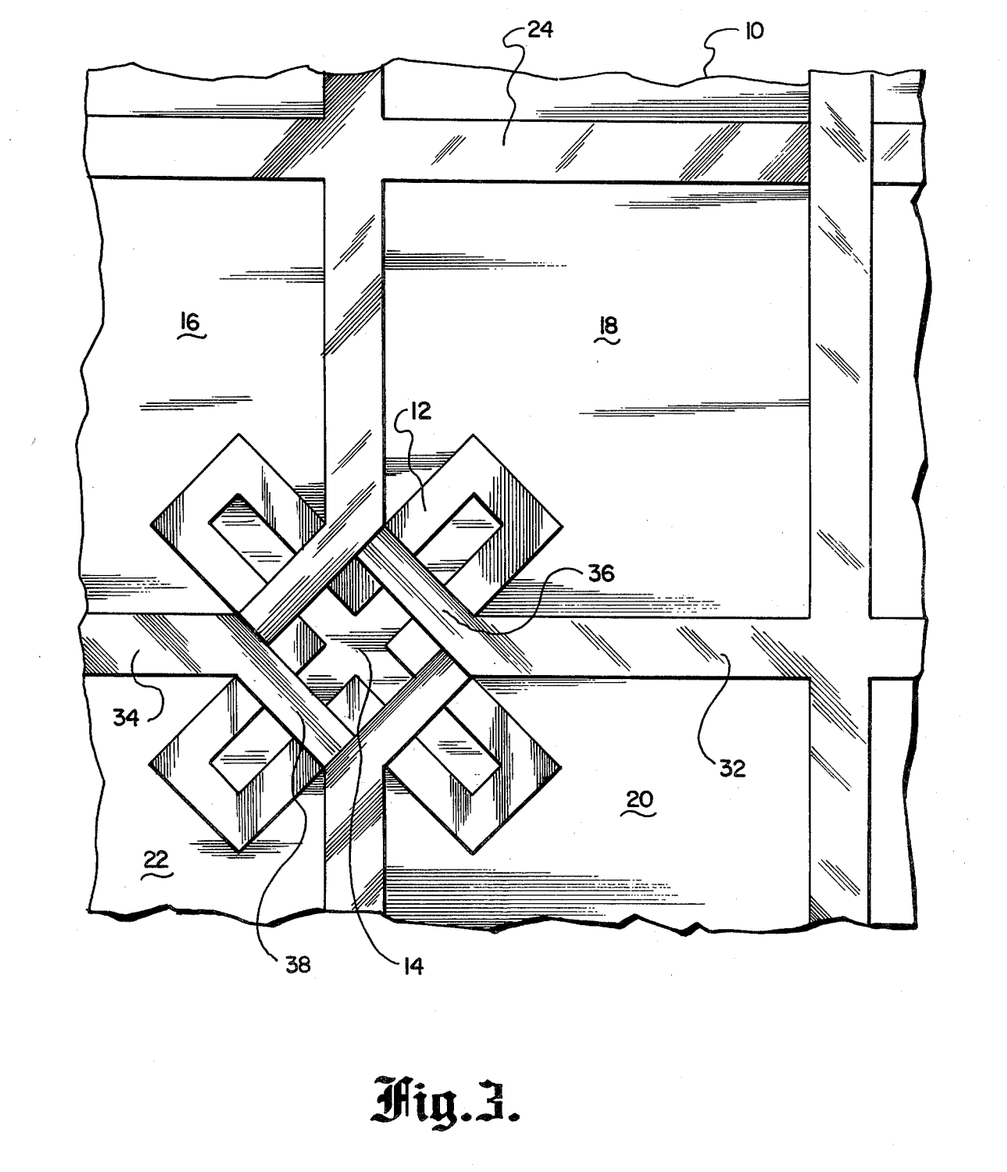

In FIG. 2 a first polysilicon line 24 is deposited on the substrate 10 over the field isolation pattern 12 and terminating in a gate 26 extending between the detector area 16 and the output area 14. The line 24 extends to each of the other output areas as well and similarly terminates in a gate at each of those areas. A second polysilicon line 28 is deposited at the same time to establish a gate 30 extending between the detector area 20 and the output area 14. FIG. 3 illustrates the next fabricating step, involving a third polysilicon line 32 and a fourth polysilicon line 34, which are deposited simultaneously and terminate in gates 36 and 38 disposed between the output area 14 and the respective detector areas 18 and 22.

Figure 4:
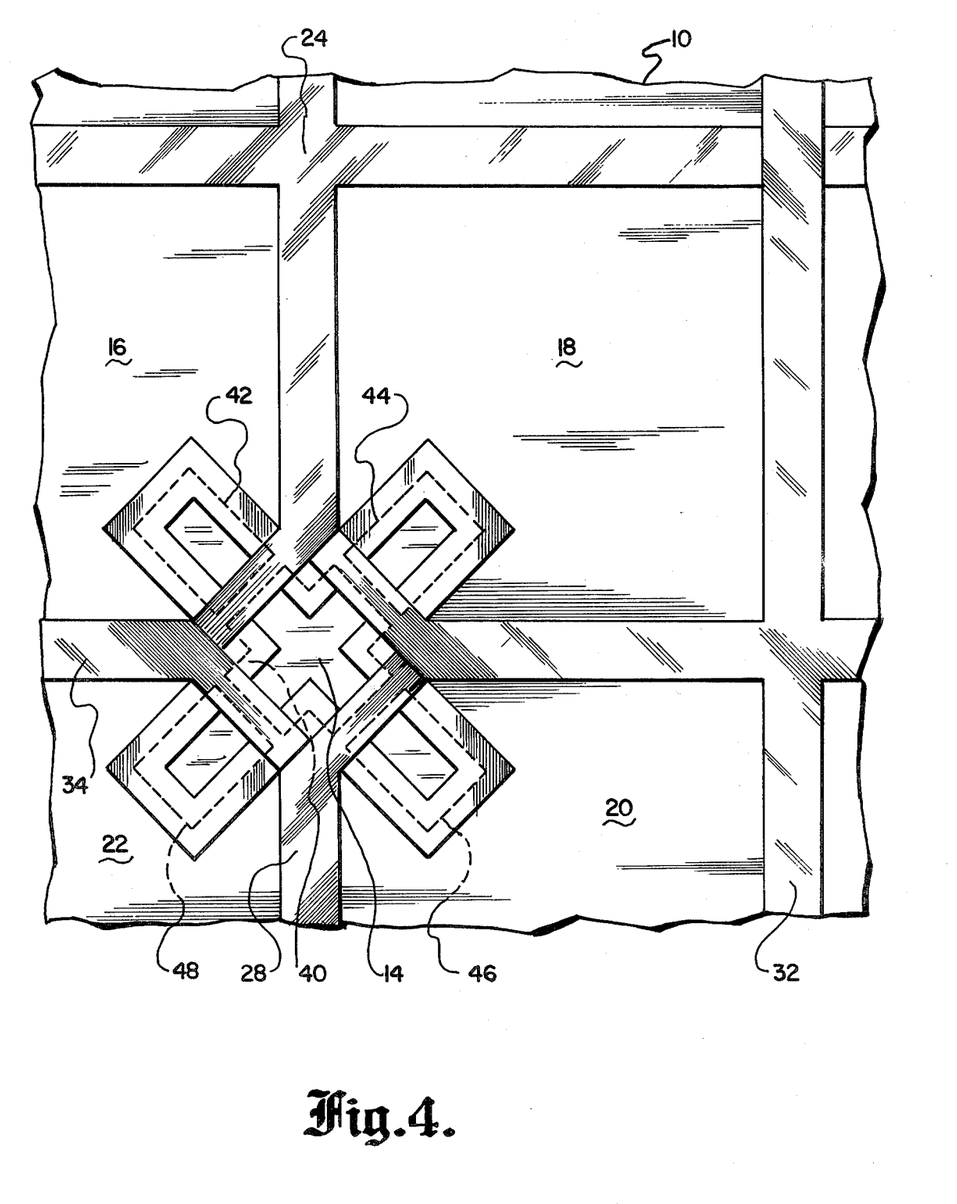

An n+ dopant is then diffused into the substrate 10 in the output area 14, as shown by the broken line 40 in FIG. 4, and into the detector areas 16, 18, 20, and 22, as shown by the broken lines 42, 44, 46, and 48.

Figure 5:
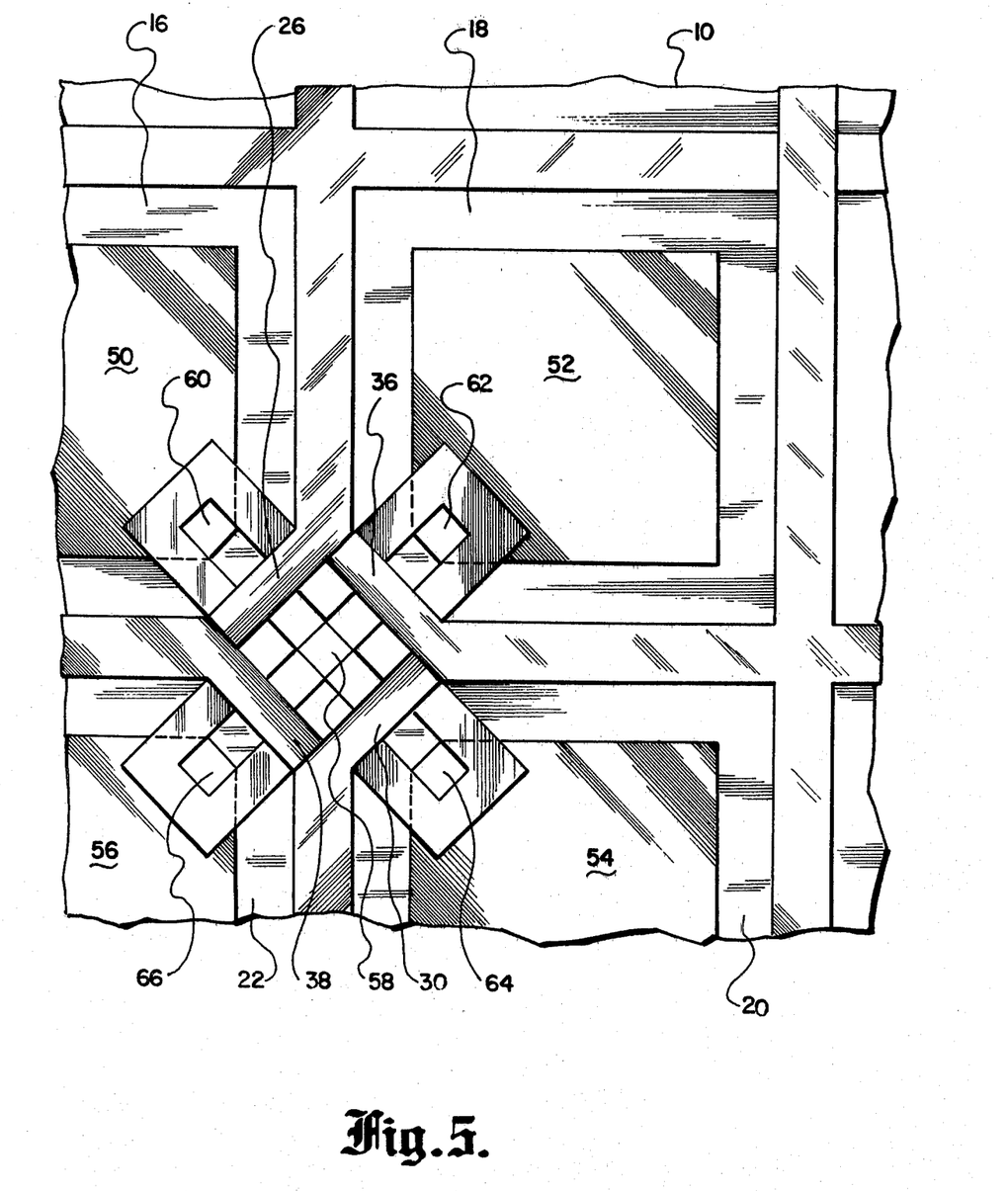

In the step shown in FIG. 5, contact holes 50, 52, 54, and 56 are opened up in the oxide layer over detector areas 16, 18, 20, and 22, a contact hole 58 is opened up over the output area 14, and contact holes 60, 62, 64, and 66 are opened in the oxide layer between the detector areas and the gates 26, 30, 36, and 38. Platinum-silicide detectors are then formed by depositing a thin (100–600 Å) film of platinum over the contact holes which were opened in the oxide and sintering the substrate 10 at temperatures in the range 300°–650° C. If it is found desirable, a phosphorous implanted guard ring may be applied to reduce excess leakage currents.

Figure 6:
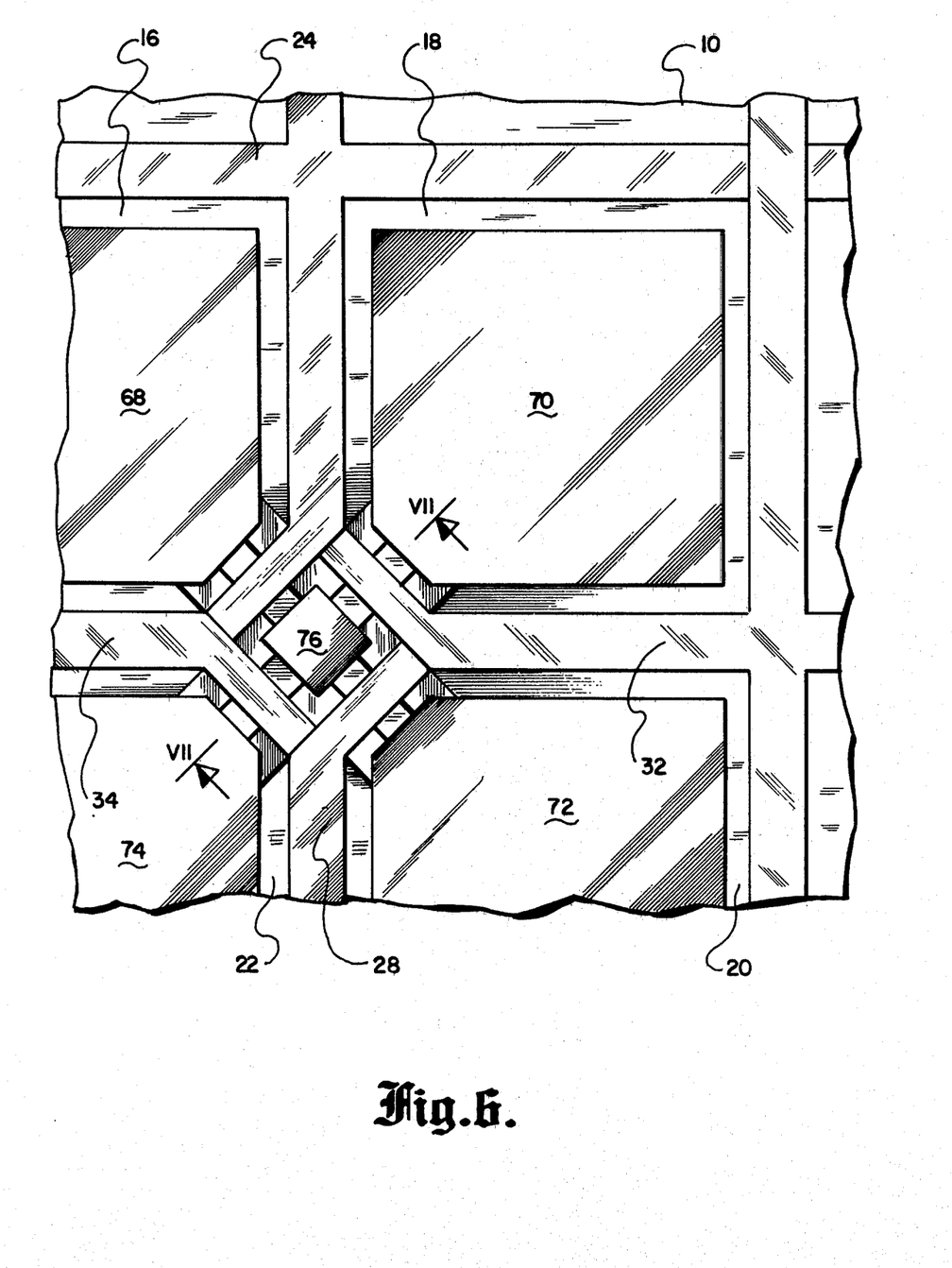

Finally, as shown in FIG. 6, metallization layers 68, 70, 72, 74, and 76 are applied over the detector areas 16, 18, 20, and 22 and the output area 14, respectively, to establish four detectors and an output point. The detector must then be joined to a CCD multiplexer, as shown in FIG. 7, which includes a cross-sectional view of the detector plane of FIGS. 1-6 along the line VII—VII of FIG. 6. The detector plane includes the p-type silicon substrate 10 which is shown with a Schottky barrier detector, which includes a platinum-silicide layer 78 and the overlying metallization layer 62. An output contact is provided for the detector group by the metal-lization layer 76. Also shown are parts of field isolation pattern 12, the n+ diffusion regions 80, 82, and 84, and the gates 36 and 38 for the third and fourth polysilicon lines 32 and 34.

The detector substrate is connected to a multiplexer substrate 86 by means of an array of indium columns, such as the column 88 connecting the output contact 76 to an input contact 90 on the multiplexer. One technique for making such a connection is disclosed in U.S. Pat. No. 4,067,104. The multiplexer includes the p-type silicon substrate 86 on which an array of input contacts, such as the contact 90, is disposed. A charge coupled circuit, such as the CCD circuitry 96, is formed on the multiplexer for converting the parallel signal from the input contacts to a serial output signal.

In operation, infrared photons 98 pass through the detector substrate and are absorbed at the platinum silicide interface, resulting in the excitation of hole carriers. Some of these holes are then emitted over the Schottky barrier into the silicon. In order to maintain charge neutrality in the metal 62, an equal number of electrons must be removed from the silicide. The particular CCD circuit shown in FIG. 7 uses direct injection to input the integrated charge into the storage well under the $V_{store}$ gate. The $V_T$ gate is constantly on, thereby reverse biasing the input diffusion 100 on the CCD chip and the output diffusion 82 on the detector chip. The charge is integrated under the reverse bias p-n junction (between the p-type substrate 10 and, e.g., n+ diffusion 80 or 84) and transferred into the CCD multiplexer by selecting a particular polysilicon gate, such as gate 26, 30, 36, or 38. The gate, together with the associated n+ diffusion regions in the substrate 10, acts as a field effect transistor switch for connecting a detector to the multiplexer circuitry through an output contact. The electrons are then injected into and integrated in the potential well created under the $V_{store}$ gate on the multiplexer chip and are multiplexed out via the CCDs. Since a storage well is provided between the detector integration site and the CCD, additional background suppression can be achieved. This can be accomplished, for example, by skimming with the transfer gate and dumping the background charge through a gated drain.

Figure 8:
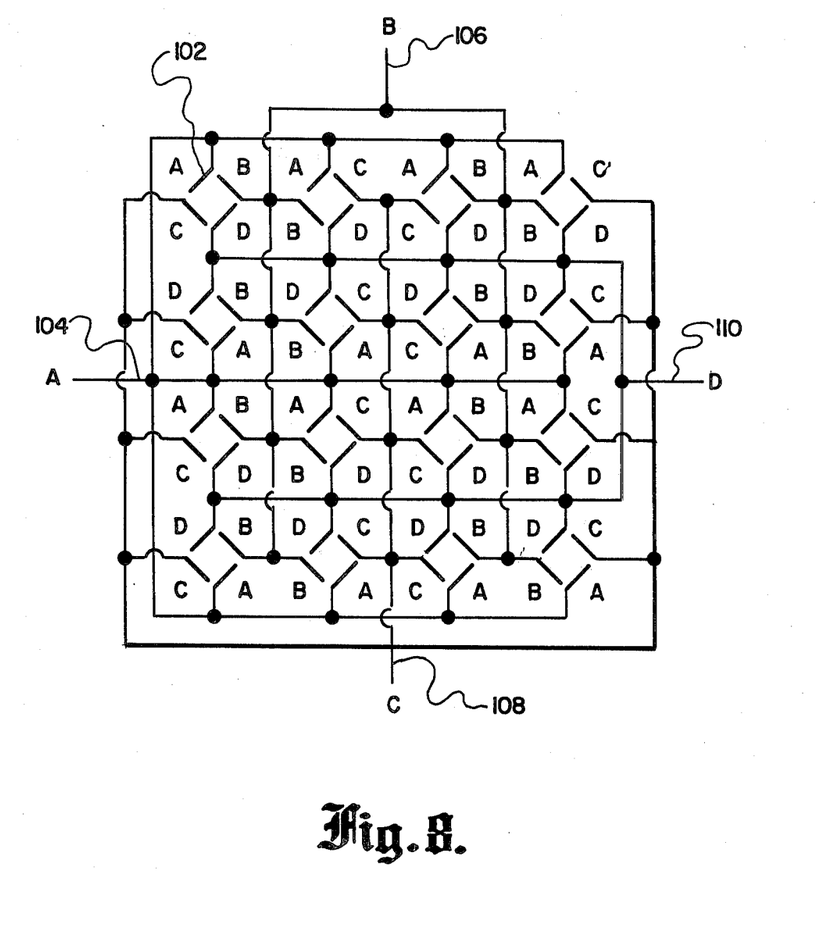
FIG. 8 is a schematic diagram illustrating the address lines for the pre-multiplexing gates of the present invention.

FIG. 8 is a schematic which illustrates how the pre-multiplexing gate lines may be arranged on the detector chip for a four to one pre-multiplexing scheme. Each diagonal line in the drawing, such as line 102, represents a gate, so that activating the "A" line 104 will connect all of the detector regions labelled "A" to the output contacts of the chip, line 106 will connect the B detectors, line 108 will connect the C detectors, and line 110 and the D detectors. Thus, by providing appropriate signals to sequentially select the pre-multiplexing gates, such as gates 26, 30, 36, and 38 shown in FIGS. 1-7, one detector from each detector group can be read out while the other three detectors are integrating.

In addition to alleviating the problems of large cell size and low fill factor in a Schottky barrier focal plane, the present invention also enables a significantly larger number of detector elements to be incorporated in the focal plane as compared to a monolithic Schottky device, given the same level of technology. Table I, for example, provides a comparison between a typical monolithic device and a four to one pre-multiplexed hybrid array constructed according to the present invention. While the total active area of the pre-multi-plexed array is not significantly greater, and fabrication is no more difficult, substantial gains can be accomplished in the active area, fill factor, and array size. The premultiplexed detector

TABLE I

| Parameter | Monolithic | Pre-Multiplexed |
| --- | --- | --- |
| Cell Size (μm) | 80 × 160 | 34 × 34 |
| Fill Factor | ~15% | ~45% |
| Array Size | 25 × 50 | 128 × 128 |
| Duty Cycle | ~100% | ~100% |
| Total Array Area (mm$^2$) | 16 | 19 | array of this invention increases the number of detectors which may be connected to one CCD input circuit while allowing each detector to integrate charge while the CCD is reading out charge, thereby achieving close to a 100% duty cycle for the device. An additional advantage of this invention is that by a simple change in the clocking scheme, the array size can be modified by combining two or more detectors. A 128×128 focal plane array, for example, can be changed to a 64×64 array by combining the signal from each four detectors. This feature may be particularly advantageous for applications such as missile seekers. When a missile approaches its target, for example, the target image enlarges, reducing the resolution required of the seeker. In this situation, the data processing load can be reduced by enlarging the unit cell or reducing the array size.

Although some typical embodiments of the present invention have been illustrated and discussed above, modifications and additional embodiments of the invention will undoubtedly be apparent to those skilled in the art. Various changes, for example, may be made in the configurations, sizes, and arrangements of the components of the invention without departing from the scope of the invention. Furthermore, equivalent elements may be substituted for those illustrated and described herein, parts or connections might be reversed or otherwise interchanged, and certain features of the invention might be utilized independently of the use of other features. Consequently, the examples presented herein, which are provided to teach those skilled in the art how to construct the apparatus and perform the method of this invention, should be considered as illustrative only and not inclusive, the appended claims being more indicative of the full scope of the invention.

What is claimed is:

1. A hybrid Schottky barrier focal plane, comprising:
a transparent semiconducting detector substrate;
an array of detector groups disposed on said detector substrate, each group comprising a plurality of Schottky barrier detectors;
an output contact on said detector substrate for each of said detector groups;
a switching device associated with each detector on said detector substrate for selectively connecting said detector to one of said output contacts;
a semiconducting multiplexer substrate;
an array of input contacts disposed on said multiplexer substrate;
a charge coupled circuit on said multiplexer substrate for connecting parallel signals from said input contacts to a serial output signal; and
an array of coupling elements, each said element electrically connecting one of said output contacts to one of said input contacts.

2. The focal plane of claim 1, wherein:
each switching device further comprises a field effect transistor, including a source connected to one of said Schottky barrier detectors, a drain connected to one of said output contacts, and a gate for controlling the connection between said source and said drain; and
said detector substrate further comprises a semiconducting substrate of a first conductivity type, said source and said drain further comprise regions of a second conductivity type in said substrate, and said gate further comprises a conducting line disposed on said substrate over said source and drain regions.

3. The focal plane of claim 2, wherein said conducting lines further comprise polysilicon lines.

4. The focal plane of claim 2, wherein said detector substrate further comprises silicon and said Schottky barrier detectors further comprise platinum silicide Schottky barrier diodes.

5. The focal plane of claim 4, wherein each coupling element further comprises an indium column between one of said output contacts and one of said input contacts.

6. A hybrid Schottky barrier focal plane, comprising:
a transparent semiconducting detector substrate of a first conductivity type;
an array of detector groups disposed on said detector substrate, each group comprising a plurality of Schottky barrier detectors;
an output contact on said detector substrate for each of said detector groups;
a field effect transistor associated with each detector, including a source region of a second conductivity type in said detector substrate and connected to said detector, a drain region of said second conductivity type in said detector substrate and connected to one of said output contacts, and a gate on said detector substrate over said source and drain regions for controlling the connection between said source region and said drain region;
a semiconducting multiplexer substrate;
an array of input contacts disposed on said multiplexer substrate;
a charge coupled circuit on said multiplexer substrate for converting parallel signals from said input contacts to a serial output signal; and
an array of coupling elements, each said element electrically connecting one of said output contacts to one of said input contacts.

7. An improved hybrid Schottky barrier focal plane of the type including a transparent semiconducting detector substrate, a semiconducting multiplexer substrate, and an array of electrical coupling elements between the detector substrate and the multiplexer substrate, wherein the improvement comprises:
an array of detector groups disposed on said detector substrate, each group comprising a plurality of Schottky barrier detectors;
an output contact on said detector substrate for each of said detector groups; and
a switching device associated with each detector for selectively connecting said detector to one of said output contacts.

8. An improved hybrid Schottky barrier focal plane of the type including a transparent semiconducting detector substrate of a first conductivity type, a semiconducting multiplexer substrate, and an array of electrical coupling elements between the detector substrate and the multiplexer substrate, wherein the improvement comprises:

an array of detector groups disposed on said detector substrate, each group comprising a plurality of Schottky barrier detectors;

an output contact on said detector substrate for each of said detector groups; and a field effect transistor associated with each detector on said substrate for selectively connecting each detector in each group to said output contact for said group, said transistor including:

a source region of a second conductivity type connected to said detector, a drain region of said second conductivity type connected to said output contact, and a gate on said substrate over said source and drain regions.

9. A hybrid Schottky barrier focal plane, comprising:

a transparent semiconducting detector substrate;

an array of detector groups disposed on said detector substrate, each group comprising a plurality of Schottky barrier detectors;

an output contact on said detector substrate for each of said detector groups;

a switching device associated with each detector on said detector substrate for selectively connecting said detector to one of said output contacts;

a semiconducting multiplexer substrate;

an array of input contacts disposed on said multiplexer substrate;

a multiplexing circuit on said multiplexer substrate for connecting parallel signals from said input contacts to a serial output signal; and an array of coupling elements, each said element electrically connecting one of said output contacts to one of said input contacts.

10. The focal plane of claim 9, wherein:

each switching device further comprises a field effect transistor, including a source connected to one of said Schottky barrier detectors, a drain connected to one of said output contacts, and a gate for controlling the connection between said source and said drain; and said detector substrate further comprises a semiconducting substrate of a first conductivity type, said source and said drain further comprise regions of a second conductivity type in said substrate, and said gate further comprises a conducting line disposed on said substrate over said source and drain regions.

11. The focal plane of claim 10, wherein said conducting lines further comprises polysilicon lines.

12. The focal plane of claim 10, wherein said detector substrate further comprises silicon and said Schottky barrier detectors further comprise platinum silicide Schottky barrier diodes.

13. The focal plane of claim 12, wherein each coupling element further comprises an indium column between one of said output contacts and one of said input contacts.

* * * * *